(12) United States Patent
Dwivedi et al.

(10) Patent No.: US 8,943,451 B2
(45) Date of Patent: Jan. 27, 2015

(54) HIERARCHICAL FINITE STATE MACHINE GENERATION FOR POWER STATE BEHAVIOR IN AN ELECTRONIC DESIGN

(75) Inventors: Pankaj Kumar Dwivedi, Varanasi (IN); Amit Srivastava, Varanasi (IN); Sachin Kakkar, Delhi (IN); Rudra Mukherjee, Calutta (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/167,415

(22) Filed: Jun. 23, 2011

(65) Prior Publication Data

US 2012/0011481 A1   Jan. 12, 2012

Related U.S. Application Data

(60) Provisional application No. 61/357,916, filed on Jun. 23, 2010.

(51) Int. Cl.
*G06F 17/50* (2006.01)

(52) U.S. Cl.
CPC .................................. *G06F 17/5081* (2013.01)
USPC ........... 716/109; 716/106; 716/111; 716/120; 716/131; 716/133

(58) Field of Classification Search
CPC ............ G06F 17/5045; G06F 2217/78; G06F 17/5081
USPC .......... 716/106, 109, 111, 120, 131, 132, 133
See application file for complete search history.

(56) References Cited

U.S. PATENT DOCUMENTS

| | | | | |
|---|---|---|---|---|
| 4,799,141 A * | 1/1989 | Drusinsky et al. | | 700/12 |
| 5,696,694 A * | 12/1997 | Khouja et al. | | 716/120 |
| 5,703,885 A * | 12/1997 | Sun et al. | | 714/738 |
| 5,801,958 A * | 9/1998 | Dangelo et al. | | 716/102 |
| 6,175,948 B1 * | 1/2001 | Miller et al. | | 716/105 |
| 6,240,376 B1 * | 5/2001 | Raynaud et al. | | 703/15 |
| 6,282,681 B1 * | 8/2001 | Sun et al. | | 714/738 |
| 6,305,006 B1 * | 10/2001 | Markov | | 716/102 |
| 6,324,496 B1 * | 11/2001 | Alur et al. | | 703/17 |
| 6,345,379 B1 * | 2/2002 | Khouja et al. | | 716/115 |
| 6,360,356 B1 * | 3/2002 | Eng | | 716/105 |
| 6,885,983 B1 * | 4/2005 | Ho et al. | | 703/14 |
| 6,917,909 B1 * | 7/2005 | Markov et al. | | 703/14 |

(Continued)

OTHER PUBLICATIONS

Ipate, F.; "Class Testing from State Diagrams Using Stream X-Machine Based Methods"; Publication Year: 2007; Software Engineering Conference, 2007. ASWEC 2007. 18th Australian; pp. 245-254.*

(Continued)

*Primary Examiner* — Helen Rossoshek

(57) ABSTRACT

The invention provides techniques and apparatuses for generating a hierarchical representation of the power behavior of an electronic design. In some implementations, a flat finite state machine, representing the power behavior of an electronic design is extracted from the power specification for the electronic design. Subsequently, a hierarchical finite state machine representation for the power behavior is generated from the flat finite state machine, the power specification and the logical specification.

20 Claims, 4 Drawing Sheets

(56) References Cited

U.S. PATENT DOCUMENTS

| | | | |
|---|---|---|---|
| 7,143,367 B2* | 11/2006 | Eng | 716/102 |
| 7,251,794 B2* | 7/2007 | Blanco et al. | 716/102 |
| 7,350,168 B1* | 3/2008 | Mathur et al. | 716/107 |
| 7,409,652 B1* | 8/2008 | Fox et al. | 716/106 |
| 7,505,951 B2* | 3/2009 | Thompson et al. | 706/45 |
| 7,512,913 B2* | 3/2009 | Matsuura | 716/136 |
| 7,602,723 B2* | 10/2009 | Mandato et al. | 370/236 |
| 7,814,442 B2* | 10/2010 | Yu | 716/100 |
| 8,677,300 B2* | 3/2014 | Koranne et al. | 716/119 |
| 2007/0067323 A1* | 3/2007 | Vandersluis | 707/100 |
| 2007/0083813 A1* | 4/2007 | Lui et al. | 715/709 |
| 2010/0223042 A1* | 9/2010 | Parker et al. | 703/6 |
| 2010/0318945 A1* | 12/2010 | Koushanfar | 716/104 |
| 2011/0061035 A1* | 3/2011 | Oishi et al. | 716/106 |
| 2011/0153546 A1* | 6/2011 | Latta et al. | 706/54 |
| 2011/0197172 A1* | 8/2011 | Yamamoto et al. | 716/111 |
| 2012/0054511 A1* | 3/2012 | Brinks et al. | 713/310 |
| 2012/0155349 A1* | 6/2012 | Bajic et al. | 370/311 |

OTHER PUBLICATIONS

Brave et al.; "Control of discrete event systems modeled as hierarchical state machines"; Publication Year: 1991; Decision and Control, 1991., Proceedings of the 30th IEEE Conference on; pp. 1499-1504 vol. 2.*

Furfaro et al.; "Model checking hierarchical communicating real-time state machines"; Publication Year: 2005; Emerging Technologies and Factory Automation, 2005. ETFA 2005. 10th IEEE Conference on; vol. 1; pp. 6 pp. -370.*

Patel et al.; "Heterogeneous Behavioral Hierarchy Extensions for SystemC"; Publication Year: 2007; Computer-Aided Design of Integrated Circuits and Systems, IEEE Transactions on; vol. 26, Issue: 4; pp. 765-780.*

Furfaro et al.; "Model checking hierarchical communicating real-time state machines"; Publication Year: 2005 Publication Year: 2005; Emerging Technologies and Factory Automation, 2005. ETFA 2005. 10th IEEE Conference on; vol. 1; pp. 6 pp. 370.*

Fummi et al.; "A hierarchical test generation approach for large controllers"; Publication Year: 2000; Computers, IEEE Transactions on; vol. 49, Issue: 4; pp. 289-302.*

* cited by examiner

US 8,943,451 B2

HIERARCHICAL FINITE STATE MACHINE GENERATION FOR POWER STATE BEHAVIOR IN AN ELECTRONIC DESIGN

REFERENCE TO RELATED APPLICATIONS

This application claims priority under 35 U.S.C. §119(e) to U.S. Provisional Patent Application No. 61/357,916 entitled "Automatic Extraction and Visualization of Hierarchical Power State Machines," filed on Jun. 23, 2010, and naming Pankaj Dwivedi et al. as inventors, which application is incorporated entirely herein by reference.

FIELD OF THE INVENTION

The present invention is directed towards design verification techniques involving power state machine visualization. More specifically, various implementations of the invention are applicable to extracting and visualizing state machines representing the power behavior within an electronic design.

BACKGROUND OF THE INVENTION

Electronic circuits, such as integrated circuits, are used in a variety of electronic systems, from automobiles to microwaves to personal computers. Designing and fabricating integrated circuits typically involves many steps, known as a "design flow." The particular steps of a design flow often are dependent upon the type of integrated circuit being designed, its complexity, the design team and the integrated circuit fabricator or foundry that will manufacture the circuit. Software and hardware "tools" are typically used at various stages of the design flow to aid in developing the design and in ensuring that the design is free from errors. The process of using hardware and software tools to aid in the design flow is often referred to as electronic design automation (EDA).

Several steps are common to most design flows. Typically, the specification for a new circuit is first described at a very abstract level. More particularly, relationships between a set of inputs and a set of outputs are described using a set of computations. This is referred to as an "algorithmic level" design or "algorithmic specification" and is often described using conventional computer programming languages, such as, for example, $C^{++}$. The algorithmic specification is then subsequently transformed, often referred to as "synthesized," into a design having a lower level of abstraction. Typically, designers synthesize the algorithmic specification into a Register Transfer Level (RTL) description of the circuit. With this type of description, the circuit is defined in terms of both the exchange of signal between hardware registers and the logical operations that are performed on those signals.

During various stages of the design flow, the behavior of the design is checked to ensure that it corresponds with the intended or expected behavior. This is often referred to as "verification." As those of ordinary skill in the art will appreciate, verification can be facilitated by a number of different methods. For example, formal verification methods utilize mathematical proofs to ensure that a designs behavior matches the intended behavior. Alternatively, a design could be simulated to aid in verification. More specifically, a software application can interpret a design, such as, for example, an algorithmic specification or a register transfer level design, and then provide a simulated set of outputs for a given set of inputs. These simulated outputs can then be used to verify the integrity of the design and make corrections where needed. As the electronic design is synthesized to lower and lower levels of abstraction, the verification process is often repeated.

As verification is often used on electronic designs having an abstract level of representation, such as, for example, an algorithmic design or a register transfer level design it can be difficult to correlate errors in the verification process to specific portions of a design. Accordingly, designers will often use a visualization tool to assist in debugging a design based upon the results of verification. More specifically, a visualization of the design, such as, for example, a finite state machine representation of the design, is often used to assist designers in tracking down erroneous states and transitions. By using a finite state machine visualization of a design, designers can graphically visualize the various states and transitions within a design. Subsequently, this visualization can be used in conjunction with the results of verification to more efficiently track down errors in the design, such as, for example, power management errors.

Conventional visualization tools typically extract the various states and transitions from the abstract representation of the design. For example, a state machine representation of a design can be extracted from a register transfer level description. As those of ordinary skill in the art will appreciate, modern electronic designs have increasingly complex power needs. As such, a second description, specific to the power behavior of the design is typically added at the register transfer level. Accordingly, many electronic designs are described using a power specification and a logical specification. Thus, a visualization that only describes the logical behavior of the circuit is often insufficient to describe the entire design behavior of modern designs.

As the complexity of the power behavior of electronic designs increases, such as, for example, with added power domains and modes, verification and visualization tools that can account for this increase in complexity are needed. Although conventional visualization tools are capable of generating simple finite state machine representations of the design behavior of a design, they are incapable of generating complex representations, such as, for example, a hierarchical representation of the power behavior of a design.

BRIEF SUMMARY OF THE INVENTION

Aspects of the invention provide for the extraction and visualization of state machines representing the various power states of a design.

In some implementations, a flat state machine, representing the power behavior of an electronic design, is extracted from the power specification for the electronic design. Subsequently, a hierarchical state machine representation for the power behavior is generated from the flat state machine, the power specification and a logical specification for the electronic design.

With some implementations, a flat state machine is extracted from the power specification by first identifying the states defined by the power specification and then determining the actions or transitions associated with each identified state. Subsequently, the flat state machine representation can be generated from the identified states and transitions.

In various implementations, a hierarchical state machine can be generated from the flat state machine based in part upon the power specification and the logical specification. For example, various implementations may use any of the following techniques to generate a hierarchical state machine: clustering related states into super states, identifying orthogonal state machines, refining dependencies within the flat state machine, overlapping aliased states, and extracting transitions from and to aliased states. With some implementations, a combination of ones of the listed techniques can be used to generate a hierarchical state machine.

These and additional implementations of invention will be further understood from the following detailed disclosure of illustrative embodiments.

BRIEF DESCRIPTION OF THE DRAWINGS

The present invention will be described by way of illustrative implementations shown in the accompanying drawings in which like references denote similar elements, and in which.

DETAILED DESCRIPTION OF THE INVENTION

The operations of the disclosed implementations may be described herein in a particular sequential order. However, it should be understood that this manner of description encompasses rearrangements, unless a particular ordering is required by specific language set forth below. For example, operations described sequentially may in some cases be rearranged or performed concurrently. Moreover, for the sake of simplicity, the illustrated flow charts and block diagrams typically do not show the various ways in which particular methods can be used in conjunction with other methods.

It should also be noted that the detailed description sometimes uses terms like "generate" to describe the disclosed implementations. Such terms are often high-level abstractions of the actual operations that are performed. The actual operations that correspond to these terms will often vary depending on the particular implementation.

Some of the methods described herein can be implemented by software stored on a computer readable storage medium or device. This software may then be executed by a computer. Furthermore, some of the disclosed methods may be implemented as part of a computer implemented electronic design automation ("EDA") tool.

Illustrative Operating Environment

Figure 1:
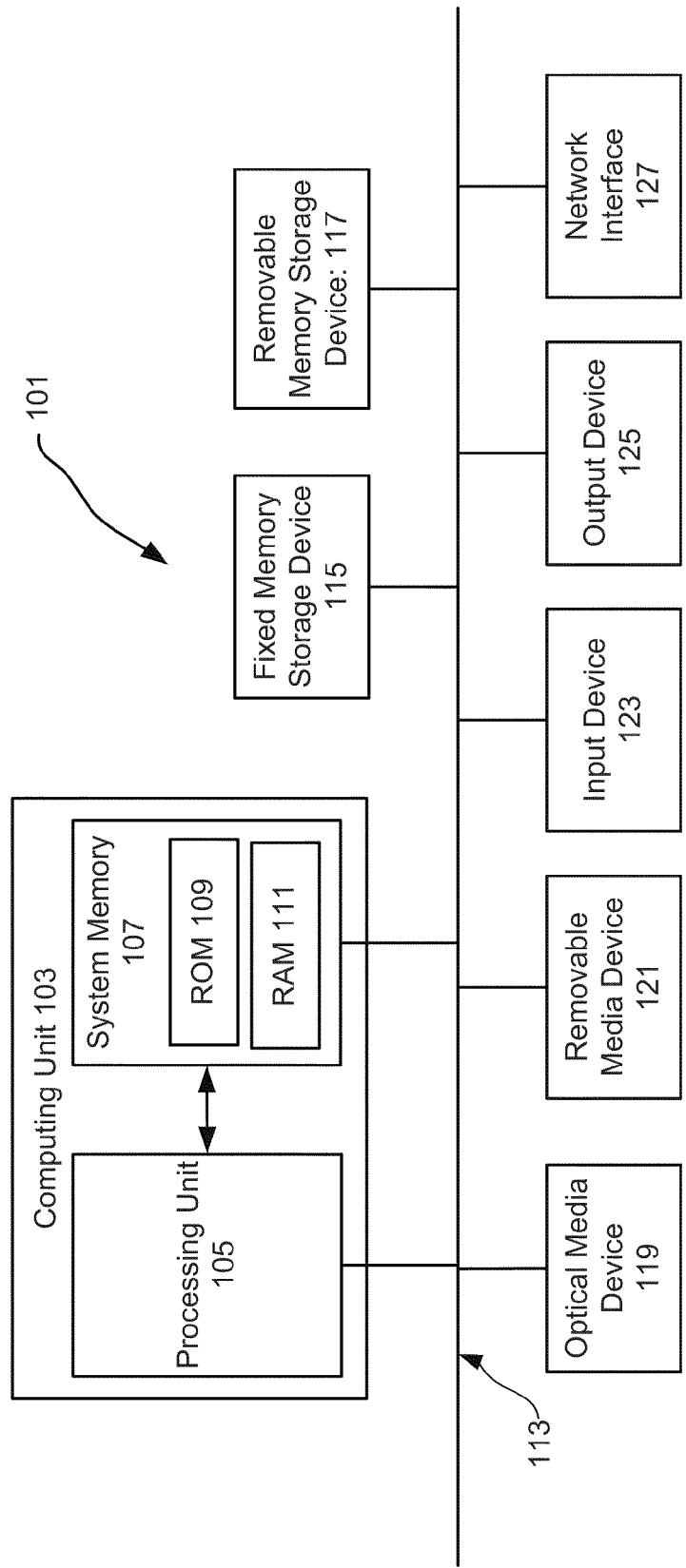
FIG. 1 shows an illustrative computing environment.

As the techniques of the present invention may be implemented using software instructions, the components and operation of a computer system on which various implementations of the invention may be employed is described. Accordingly, FIG. 1 shows an illustrative computing device 101. As seen in this figure, the computing device 101 includes a computing unit 103 having a processing unit 105 and a system memory 107. The processing unit 105 may be any type of programmable electronic device for executing software instructions, but will conventionally be a microprocessor. The system memory 107 may include both a read-only memory ("ROM") 109 and a random access memory ("RAM") 111. As will be appreciated by those of ordinary skill in the art, both the ROM 109 and the RAM 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional devices, such as; a fixed memory storage device 115, for example, a magnetic disk drive; a removable memory storage device 117, for example, a removable solid state disk drive; an optical media device 119, for example, a digital video disk drive; or a removable media device 121, for example, a removable floppy drive. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computing device 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus ("USB") connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol ("TCP") and the Internet protocol ("IP"). Also, the interface 127 may employ any suitable connection agent (or combination of agents) for connecting to a network, including, for example, a wireless transceiver, a modem, or an Ethernet connection.

It should be appreciated that the computing device 101 is shown here for illustrative purposes only, and it is not intended to be limiting. Various embodiments of the invention may be implemented using one or more computers that include the components of the computing device 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

As stated above, various embodiments of the invention may be implemented using software instructions. These software instructions may be stored on one or more computer readable media or devices, such as, for example, the system memory 107, or an optical disk for use in the optical media device 119. As those of ordinary skill in the art will appreciate, software instructions stored in the manner described herein are inherently non-transitory in nature. More specifically, the software instructions are available for execution by the computer system 101, as opposed to being transmitted to the computer system via a carrier wave or some other transitory signal.

Hierarchical Power State Machine Extraction and Visualization

As indicated above, many modern integrated circuits have multiple power states. More particularly, some circuits provide for a portion of the circuit to operate at one power level while another portion of the circuit operates at a different power level. As these two portions of the integrated circuit can receive different power levels simultaneously, they are said to be in different "power domains." It is not uncommon for some circuits to include 40 or more power domains. Furthermore, within each power domain, the level of power that the circuit consumes at a given time can vary. The amount of power the domain is using is referred to as the "power mode." It is also not uncommon for a design to have between 100 and 200 different power modes. As a result, an integrated circuit can have between a few thousand and many tens of thousands of different possible power states.

The power functionality of a design is typically described using one of a number of different power specification standards. One such standard is the unified power format (UPF) standard. A power specification, such as, for example, a UPF specification, is used in conjunction with a logical specification to describe the power functionality of a design. More particularly, the power specification typically describes the different power domains and modes and references components and portions of the design defined by the logical specification.

At this point it is important to make a distinction between a hierarchical state machine and a flat state machine. As those of ordinary skill in the art will appreciate, a state machine is a diagram listing available states and transitions between these states. Finite state machine are commonly used to represent a system. This representation can take a number of different forms. In some cases the representation can be visual and graphical displayed on a display device or printed. In other cases, the representation can be text based, in such a case, the representation will often be used by another electronic design automation tool to assist is some portion of the design process. As knowledge of basic state machines are known to those of ordinary skill in the art, it is not further covered herein.

A flat state machine lists each and every state and transition of the system for which it describes in a single layer. As those of ordinary skill in the art will also appreciate, flat finite state machines suffer what is traditionally referred to as "state and transition explosion," which means that the complexity of a flat state machine grows much faster than the complexity of the system it describes. More particularly, as a system becomes more complex, a flat state machine representing that system exponentially becomes more complex. For example, as introduced above, some modern electronic designs include a thousand or more different power states. If a flat state machine were to be generated to represent each of these thousand different states, it would be unmanageably large. This results from that fact that flat state machines repeatedly represent similar events.

Consider a calculator that has a Clear and an Off button. Although the response of the calculator to a user pressing either the Clear or the Off button is handled identically in many states. A flat state machine will include a representation of the action associated with this button press repeated throughout the state machine. A hierarchical state machine addresses this problem by allowing similar components of a flat state machine to be represented together. Additionally, hierarchical state machines may provide different layers of representation, for example a first layer may show components that are grouped together for some reason as a single component and another layer may show the grouped components separately. For example, all transitions to the Clear or Off button state from the calculator example given above could be represented as a single transition in a hierarchical state machine. Thus reducing the size of the state machine and making it more manageable to work with. Hierarchical finite state machines and particularly their application to electronic design automation are discussed in greater detail in *Supervisory Control Problems of hierarchical Finite State Machines*, by H. Marchand and B. Gaudin, Proceedings of the 41$^{st}$ IEEE Conference on Decision and Control, December 2002, pp. 1199-1204, which article is incorporated entirely herein by reference.

Figure 2:
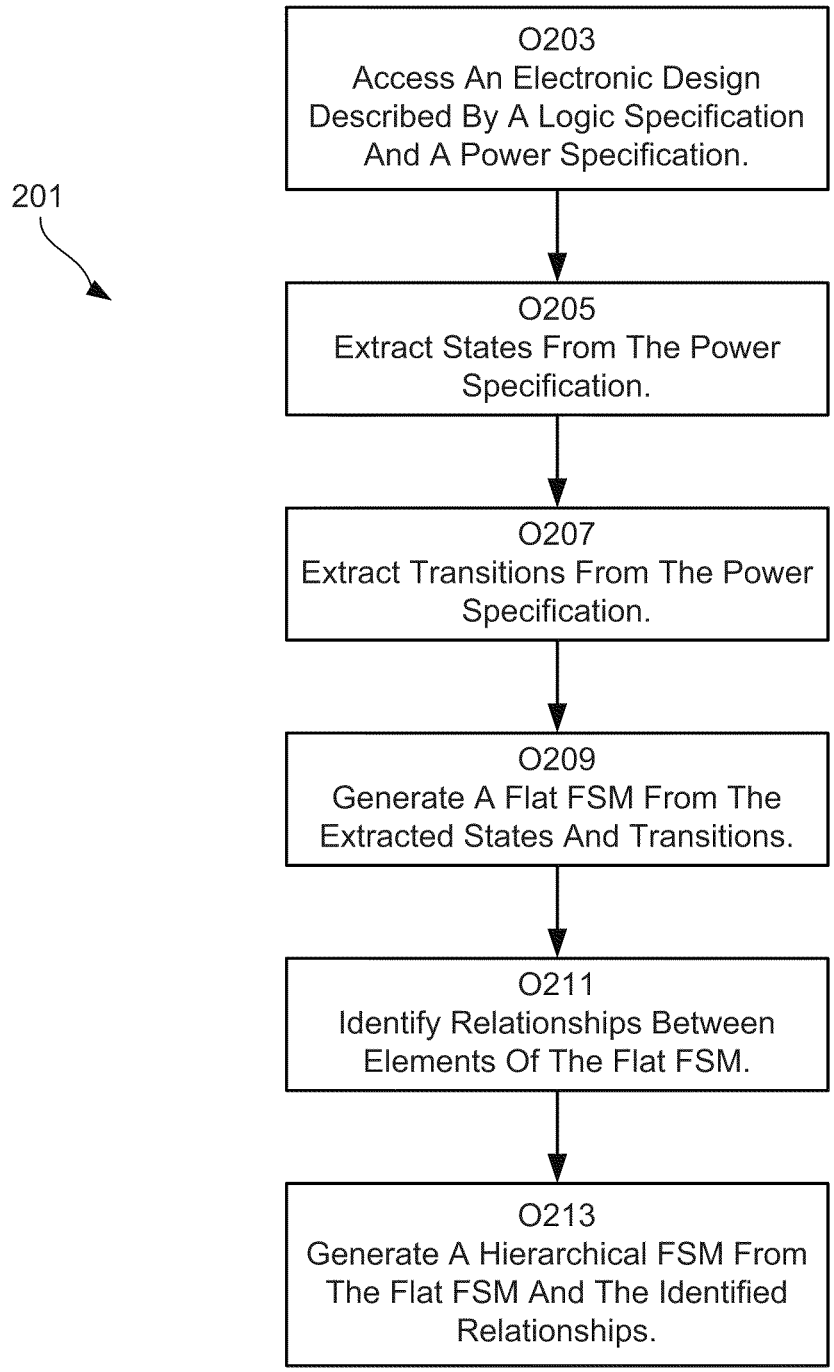
FIG. 2 illustrates a method of generating a hierarchical finite state machine representation of the power behavior of an electronic design.
Figure 3:
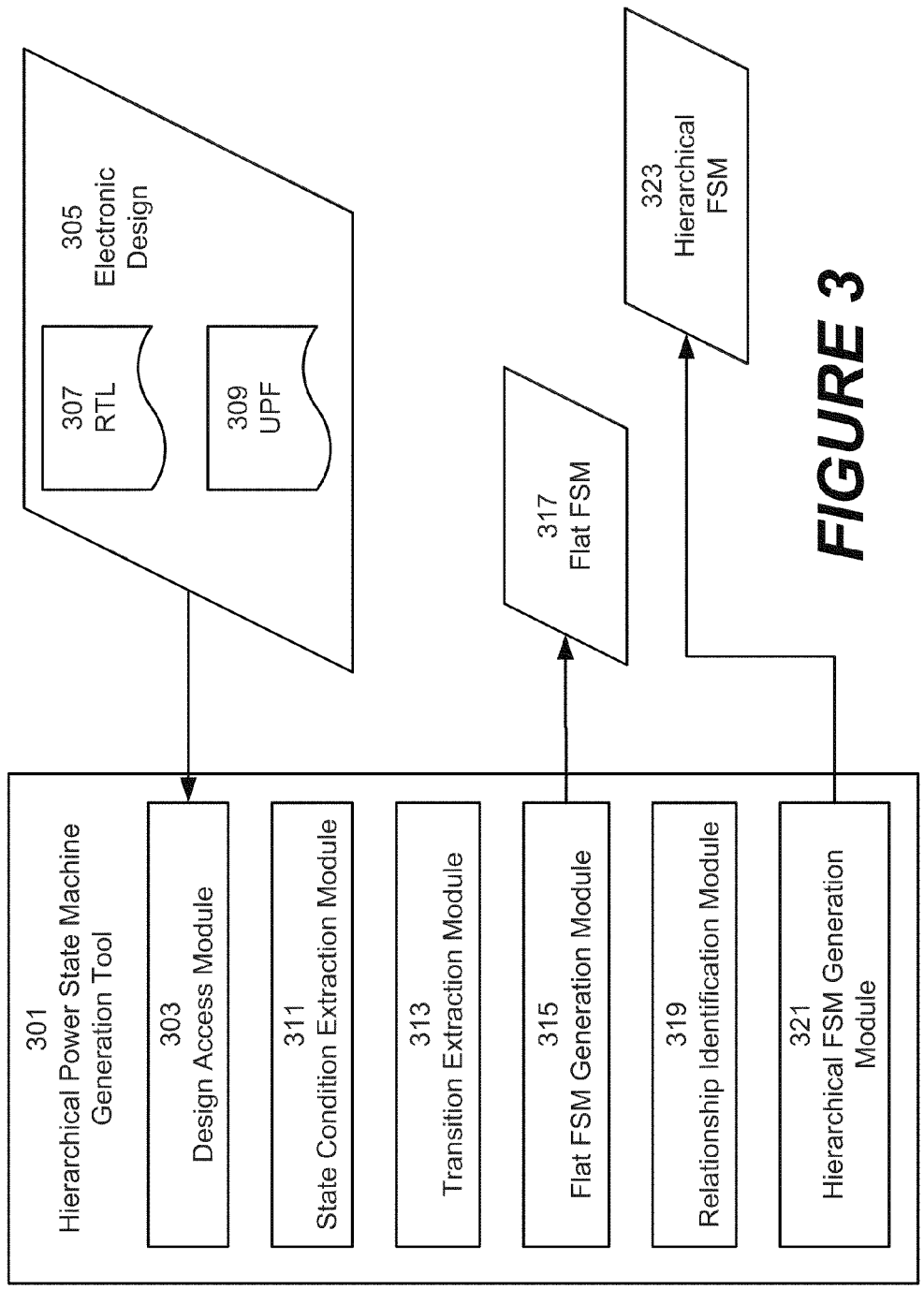
FIG. 3 illustrates a hierarchical power state machine generation tool.

Various implementations of the invention may be provided to generate a hierarchical state machine representation of the power behavior of an electronic design. Subsequently, this hierarchical power state machine may be used by designers to identify errors in the power specification based upon results from a verification process. FIG. 2 illustrates a method 201 for generating a hierarchical power state machine according to various implementations of the present invention. FIG. 3 illustrates a hierarchical power state machine generation tool 301 that may be provided by various implementations of the invention to generate a hierarchical finite state machine representing the power behavior of an electronic design. Reference to both FIG. 2 and FIG. 3 will be made in describing the various illustrative implementations below.

The method 201 includes an operation 203 for accessing an electronic design described by a logic specification and a power specification. In various implementations, the electronic design will be described as a register transfer level design having a corresponding power specification. With some implementations, the electronic design accessed by the operation 203 will be a portion of an electronic design as opposed to a complete electronic design. FIG. 3 shows the tool 301, having an access module 303 configured to access an electronic design. As shown, the module 303 is accessing an electronic design 305, which includes a register transfer level (RTL) specification 307 and a unified power format (UPF) specification 309. Various implementations, may cause the electronic design, or portion thereof, to be accessed by causing the design to be loaded onto a data storage location accessible by a computer system, such as, for example, the RAM 111 or the fixed memory storage device 115 shown in FIG. 1.

The method 201 additionally includes an operation 205 for extracting states from the power specification. The individual states corresponding to the different power modes can be inferred from objects within the electronic design. As those of ordinary skill in the art will appreciate, objects, such as, for example, supply ports, supply nets, power switches, and power domains will be defined within the UPF specification 309. The tool 301 includes a state extraction module 311 configured to extract states from the electronic design 305.

A portion of an example UPF specification, defining various combinations of power states of supply nets is shown below. Assume that the 2 nets defined below are primary supply nets corresponding to the 2 power domains PD_ALU and PD_RAM, which constitute power states of the power state table "MyPowerStateTable," as shown below.

```
create_pst MyPowerStateTable -supplies
{PD_ALU_primary_power PD_RAM_primary_power}
    add_pst_state Reboot -pst MyPowerStateTable -state
    {off ram_norm}
    add_pst_state Sleep -pst MyPowerStateTable -state {alu_norm off}
    add_pst_state Hibernate -pst MyPowerStateTable -state
    {alu_norm ram_norm}
    add_pst_state Complete_on -pst MyPowerStateTable -state
    {full_on full_on}
```

As can be seen from this example, state machines for two ports (i.e. out_sw_PD_ALU and out_sw_PD_RAM) and one power state table (i.e. MyPowerStateTable) are being modeled.

The method 201 also includes an operation 207 for extracting the state conditions from the power specification. A state condition extraction module 313 is provided by the tool 301. The module 313 is configured to extract the state conditions from the UPF specification 309. These extracted state conditions, will become the transitions within the power state machine. For example, referring to the example UPF specification shown above, two state conditions for the supply net ExampleSupply are defined, namely Condition) and Condition2. The condition for the state of CompleteOn is Condition1 equals Full and Condition2 equals Full. The conditions for the other three states (i.e. Reboot, Sleep, and Hibernate) can also be identified from the example UPF specification.

Figure 4:
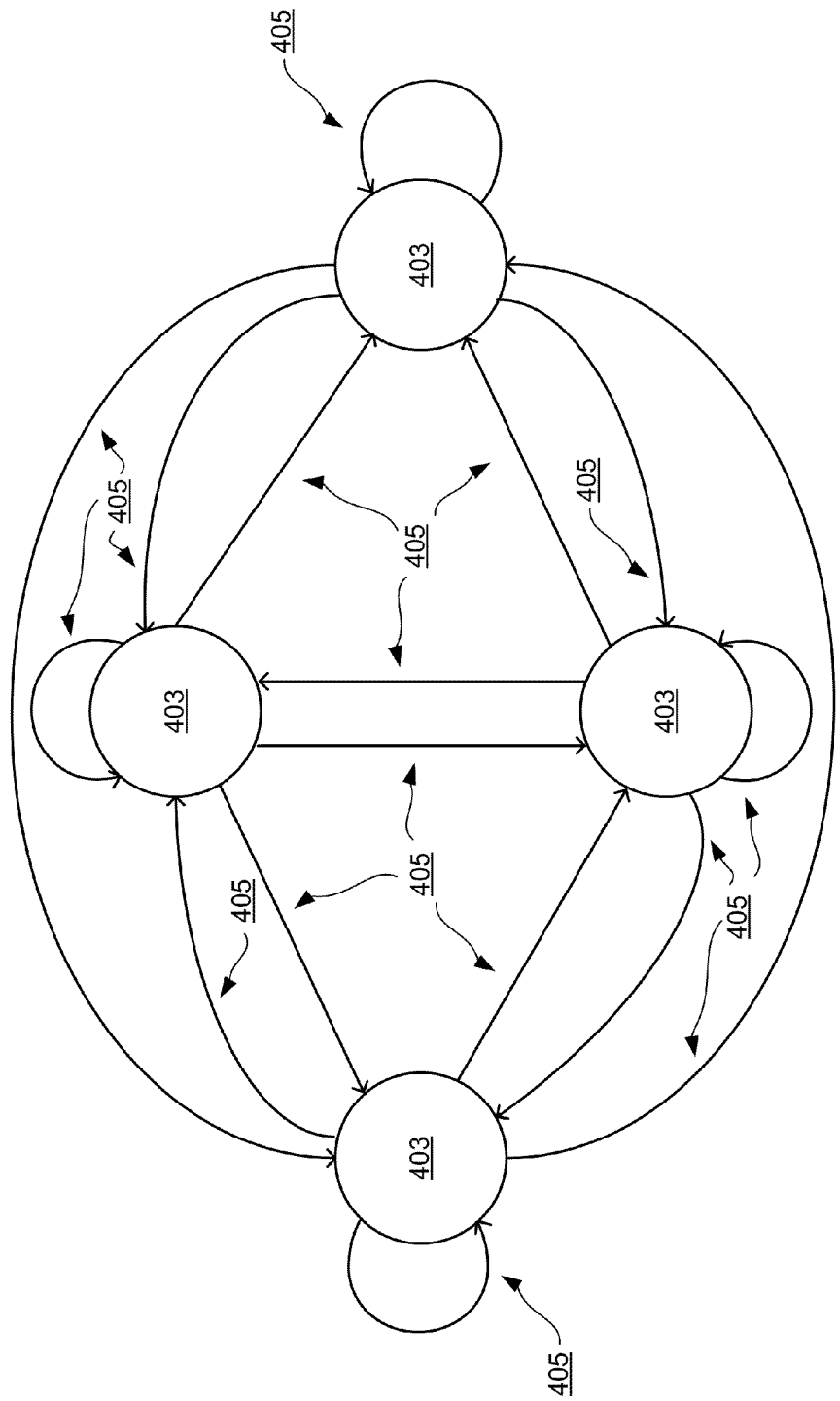
FIG. 4 illustrates a flat and hierarchical power state machine.

An operation 209 for generating a flat finite state machine (FSM) representation for the extracted states and transitions is provided. FIG. 4 illustrates a finite state machine 401 that has been generated based on the above example UPF specification according to various implementations of the present invention. As can be seen from this figure, the finite state machine 401 includes four states 403 and transitions 405 between the states 403. The tool 301 includes a flat finite state machine generation module 315, which is configured to generate a flat finite state machine 317 from the UPF specification 309 based on the extracted states and conditions.

In various implementations, the module 315 is configured to generate a data file that describes the flat finite state machine. For example, finite state machines may be described by the Extensible Markup Language (XML). Accordingly, an XML file describing the flat finite state machine may be generated by the module 315. In some implementations, the module 315 may also be configured to display a graphical representation of the flat finite state machine 317, similar to the representation shown in FIG. 4. In further implementations, the module 315 may be configured to output the graphical representation of the finite state machine 317 to a display device, such as, for example, an LCD display device configured as the output device 125 of the computer system shown in FIG. 1.

The method 201 additionally includes an operation 211 for identifying relationships between elements of the flat finite state machine. In some implementations, related states may be clustered into super states. More specifically, states that have a similar outcome or result may be represented as the same state. For example, many electronic components, such as, certain types of memory circuits require a threshold amount of power to retain the logical values that are stored in the memory circuit. In cases where multiple levels of power states (i.e. power modes) are defined, such as, for example, Full Power, Half Power and No Power, if the memory circuit required full power to retain its logical value, then the outcome from transitioning to either the Half Power or the No Power state would be the same. That is, either transition would cause the logical values stored in the memory circuit to become corrupted and possibly lost. Thus, the Half Power and No Power states may be represented as a single super state.

The operation 211 may identify these different states and the results of the associated transitions on the components of the design from the logical specification and the power specification. A relationship identification module 319 is provided by the tool 301 to identify relationships between elements of the flat finite state machine 317 based upon the RTL specification 307 and the UPF specification 309.

An operation 213 for generating a hierarchical finite state machine from the flat finite state machine and the identified relationships is also provided by the method 201. A hierarchical finite state machine generation module 321 is also provided by the tool 301 to generate a hierarchical finite state machine 323. Similar to the flat finite state machine generation module 315, the module 321 is configured to generate a data file that describes the hierarchical finite state machine 323. The module 321 may also be configured to generate a graphical representation of the hierarchical finites state machine.

The module 319 may be configured to identify a number of different relationships, such as, for example, super states as described above. A few other example relationships are described below. In various implementations, any number or combination of relationships may be identified during the operation 211 and then used to generate a hierarchical finites state machine during the operation 213.

With some implementations, orthogonal regions within the flat finite state machine 317 are identified. More particularly, portions of the flat finite state machine 317 that operate concurrently yet independently from each other, such as, for example, two different power domains within the electronic design may be identified as orthogonal. Orthogonal regions may be represented in the hierarchical finite state machine 323 using separate regions for each orthogonal component.

In various implementations, dependencies between states are refined. For example, in many cases, when a supply port changes state, it causes the supply net of which the supply port is a part to also change state, which then causes the power domain of which the supply net if a part to change state. This dependence from one section of the flat finite state machine 317 to another can be refined and represented hierarchically. More specifically, transitions that cause other transitions can be combined.

Some implementations may look for overlapping states also referred to as aliased states. Overlapping states are states that can be reached under the same conditions or events. For example, in some designs a transition from one state can lead to two different states. These overlapping states may also be represented hierarchically.

With various implementations, redundant transitions between supers states and aliased states can be identified and removed from the hierarchical finite state machine.

Conclusion

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. A method comprising:
   generating, by a computing system, a flat finite state machine representation of at least a portion of an electronic design based, at least in part, on power state information described in a power specification of the electronic design;
   identifying, by the computing system, relationships between power states, between transitions associated with the power states, or between at least one of the power states and at least one of the transitions associated with the power states in the flat finite state machine representation based, at least in part, on the power specification and a logical specification corresponding to at least the portion of the electronic design; and
   generating, by the computing system, a hierarchical finite state machine representation of at least the portion of the electronic design based, at least in part, on the flat finite state machine representation and the identified relationships.

2. The method recited in claim 1, wherein the logical specification is a register transfer level description of at least the portion of the electronic design and the power specification is a unified power format description of at least the portion of the electronic design.

3. The method recited in claim 1, further comprising extracting, by the computing system, the power states and the transitions associated with the power states from the power specification of the electronic design.

4. The method recited in claim 3, wherein extracting the power states further comprises:
identifying a plurality of objects within the electronic design from the logical specification; and
determining one or more states for each of the plurality of objects from the power specification.

5. The method recited in claim 3, wherein extracting the transitions associated with the power states includes identifying one or more state conditions for each of the plurality of power states from the power specification.

6. The method recited in claim 1, wherein identifying relationships in the flat finite state machine representation further comprises identifying different power domains in the flat finite state machine representation, and wherein the hierarchical finite state machine representation is generated to include separate regions corresponding to the different power domains based, at least in part, on the identification of the different power domains.

7. The method recited in claim 1, further comprising utilizing, by the computing system, the hierarchical finite state machine representation of at least the portion of the electronic design to assist in verification or visual presentation of the electronic design.

8. An apparatus comprising at least one computer-readable memory device storing instructions configured to cause one or more processing devices to perform operations comprising:
extracting power state information from a power specification of an electronic design, wherein the power state information includes power states and transitions associated with the power states corresponding to at least a portion of the electronic design;
identifying relationships between the power states, between the transitions associated with the power states, or between at least one of the power states and at least one of the transitions associated with the power states in the power state information based, at least in part, on a logical specification corresponding to at least the portion of the electronic design; and
generating a hierarchical finite state machine representation of at least the portion of the electronic design based, at least in part, on the identified relationships in the power state information.

9. The apparatus recited in claim 8, wherein the instructions are configured to cause the one or more processing devices to perform operations further comprising generating a flat finite state machine representation of at least the portion of the electronic design based, at least in part, on the power state information.

10. The apparatus recited in claim 9, wherein identifying the relationships in the power state information is based, at least in part, on the flat finite state machine representation.

11. The apparatus recited in claim 9, wherein generating the hierarchical finite state machine representation is based, at least in part, on the flat finite state machine representation and the identified relationships in the power state information.

12. The apparatus recited in claim 8, wherein the instructions are configured to cause the one or more processing devices to perform operations further comprising identifying different power domains of the electronic design, and wherein the hierarchical finite state machine representation is generated to include separate regions corresponding to the different power domains based, at least in part, on the identification of the different power domains.

13. The apparatus recited in claim 8, wherein the instructions are configured to cause the one or more processing devices to perform operations further comprising utilizing the hierarchical finite state machine representation of at least the portion of the electronic design to assist in verification or visual presentation of the electronic design.

14. A system comprising:
a memory system storing instructions; and
a computing system having one or more processing devices, in response to executing the instructions, are configured to:
generate a flat finite state machine representation of at least a portion of an electronic design based, at least in part, on power state information described in a power specification of the electronic design;
identify relationships between power states, between transitions associated with the power states, or between at least one of the power states and at least one of the transitions associated with the power states in the flat finite state machine representation based, at least in part, on the power specification and a logical specification corresponding to at least the portion of the electronic design; and
generate a hierarchical finite state machine representation of at least the portion of the electronic design based, at least in part, on the flat finite state machine representation and the identified relationships.

15. The system recited in claim 14, wherein the logical specification is a register transfer level description of at least the portion of the electronic design and the power specification is a unified power format description of at least the portion of the electronic design.

16. The system recited in claim 14, wherein the one or more processing devices, in response to executing the instructions, are further configured to extract the power state information from the power specification of the electronic design.

17. The system recited in claim 16, wherein the one or more processing devices, in response to executing the instructions, are further configured to identify multiple objects within the electronic design from the logical specification, and determine one or more power states for the objects from the power specification.

18. The system recited in claim 16, wherein the one or more processing devices, in response to executing the instructions, are further configured to extract transitions associated with power states by identifying one or more state conditions for at least one of the power states in the power specification.

19. The system recited in claim 14, wherein the one or more processing devices, in response to executing the instructions, are further configured to identify different power domains in the flat finite state machine representation, and wherein the hierarchical finite state machine representation is generated to include separate regions corresponding to the different power domains based, at least in part, on the identification of the different power domains.

20. The system recited in claim 14 wherein the one or more processing devices, in response to executing the instructions, are further configured to utilize the hierarchical finite state machine representation of at least the portion of the electronic design to assist in verification or visual presentation of the electronic design.

* * * * *